US010310373B2

(12) United States Patent
Yamada et al.

(10) Patent No.: US 10,310,373 B2
(45) Date of Patent: Jun. 4, 2019

(54) METHOD FOR MANUFACTURING MASK BLANK SUBSTRATE, METHOD FOR MANUFACTURING MASK BLANK AND METHOD FOR MANUFACTURING TRANSFER MASK

(71) Applicant: HOYA CORPORATION, Tokyo (JP)

(72) Inventors: Takeyuki Yamada, Tokyo (JP); Takahito Nishimura, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 14/760,506

(22) PCT Filed: Jan. 8, 2014

(86) PCT No.: PCT/JP2014/050110
§ 371 (c)(1),
(2) Date: Jul. 13, 2015

(87) PCT Pub. No.: WO2014/112409
PCT Pub. Date: Jul. 24, 2014

(65) Prior Publication Data
US 2015/0355537 A1  Dec. 10, 2015

(30) Foreign Application Priority Data

Jan. 18, 2013  (JP) .................................. 2013-007074

(51) Int. Cl.
*G03F 1/60* (2012.01)
*C23C 14/14* (2006.01)
(Continued)

(52) U.S. Cl.
CPC ................ *G03F 1/60* (2013.01); *B24B 37/04* (2013.01); *C23C 14/0036* (2013.01);
(Continued)

(58) Field of Classification Search
CPC ...... G03F 1/60; G03F 1/80; G03F 1/32; G03F 1/50; C23C 14/0641; C23C 14/0676; C23C 14/14; C23C 14/0036; B24B 37/04
See application file for complete search history.

(56) References Cited

U.S. PATENT DOCUMENTS

2005/0148291 A1* 7/2005 Ohashi ................. B24B 37/044
451/41
2006/0251809 A1* 11/2006 Hata ....................... G03F 7/162
427/240
(Continued)

FOREIGN PATENT DOCUMENTS

JP  2000-330262 A  11/2000
JP  2006-114632 A  4/2006
(Continued)

OTHER PUBLICATIONS

International Search Report of PCT/JP2014/050110 dated Apr. 1, 2014 [PCT/ISA/210].

*Primary Examiner* — Nadine G Norton
*Assistant Examiner* — Mahmoud Dahimene
(74) *Attorney, Agent, or Firm* — Sughrue Mion, PLLC

(57) ABSTRACT

A method for manufacturing a low-defect and high-quality mask blank substrate with minimized transfer pattern defects and high mechanical strength, particularly such that the occurrence of a phenomenon where a portion of a transfer pattern and a principal surface of the substrate therebeneath are broken off together is minimized such that there is little pattern loss. The mask blank is manufactured by preparing a mask blank substrate (X) having a substrate principal surface (X1) polished using a polishing solution containing abrasive grains, etching the substrate principal surface (X1) using catalyst-referred etching so as to remove damaged portions from the principal surface (X1), and then depositing (Continued)

a thin film that forms a transfer pattern on the substrate principal surface (X1) of the substrate (X) by sputtering.

20 Claims, 4 Drawing Sheets

(51) Int. Cl.
| | |
|---|---|
| *B24B 37/04* | (2012.01) |
| *G03F 1/32* | (2012.01) |
| *C23C 14/00* | (2006.01) |
| *G03F 1/50* | (2012.01) |
| *C23C 14/06* | (2006.01) |
| *G03F 1/80* | (2012.01) |

(52) U.S. Cl.
CPC ...... *C23C 14/0641* (2013.01); *C23C 14/0676* (2013.01); *C23C 14/14* (2013.01); *G03F 1/32* (2013.01); *G03F 1/50* (2013.01); *G03F 1/80* (2013.01)

(56) References Cited

U.S. PATENT DOCUMENTS

| | | | |
|---|---|---|---|
| 2011/0159785 A1* | 6/2011 | Harada | .............. C03C 15/02 |
| | | | 451/36 |
| 2014/0326612 A1* | 11/2014 | Yamauchi | ........... B24B 37/046 |
| | | | 205/766 |

FOREIGN PATENT DOCUMENTS

| | | | |
|---|---|---|---|
| JP | 2008-071857 A | 3/2008 |
| JP | 2008-081389 A | 4/2008 |
| JP | 2009-117782 A | 5/2009 |
| JP | 4506399 B2 | 7/2010 |
| JP | 4526547 B2 | 8/2010 |
| JP | 2010-188487 A | 9/2010 |
| JP | 2012-064972 A | 3/2012 |

* cited by examiner

SRAF (sub-resolution assist feature) pattern line width: 106nm

METHOD FOR MANUFACTURING MASK BLANK SUBSTRATE, METHOD FOR MANUFACTURING MASK BLANK AND METHOD FOR MANUFACTURING TRANSFER MASK

CROSS REFERENCE TO RELATED APPLICATIONS

This application is a National Stage of International Application No. PCT/JP2014/050110, filed Jan. 8, 2014, claiming priority based on Japanese Patent Application No. 2013-007074, filed Jan. 18, 2013, the contents of all of which are incorporated herein by reference in their entirety.

TECHNICAL FIELD

This invention relates to a method for manufacturing a mask blank substrate, a method for manufacturing a mask blank using a mask blank substrate with a transfer pattern forming thin film formed by sputtering method, and a method for manufacturing a transfer mask using the mask blank.

BACKGROUND ART

Due to the recent development in higher density and higher precision of highly integrated circuits such as super-LSI devices, requirements for smoothness and surface defects of a substrate for electronic devices such as a mask blank substrate are becoming stricter year by year.

As an example of a conventional method to reduce minute convex surface defects on a principal surface of a mask blank substrate, a so-called light etching method is known, in which, after local chemical mechanical polishing (CMP) for polishing a principal surface of a quartz glass substrate for mask blank with a polishing solution including colloidal silica grains, the principal surface is cleaned with low-concentration hydrofluoric acid solution (Patent Document 1). Light etching in this cleaning method is for the purpose of enhancing cleaning effect by lifting and removing (lift-off) foreign matters attached to the principal surface of the substrate.

On the other hand, in the cleaning step of a substrate before application of a resist in a lithography step, a cleaning process such as RCA cleaning is employed using a combination of physical cleaning tools such as a megasonic nozzle and a brush and chemical cleaning tools such as APM (ammonium hydrogen peroxide mixture) and SPM (sulfuric acid hydrogen peroxide mixture) to remove foreign matters attached to a principal surface of the substrate.

Further, as an example of a cleaning method of a photomask (transfer mask), a method is known in which foreign matters attached to a surface of a photomask are removed by applying physical energy such as megasonics in hydrogen gas dissolved water (Patent Document 2).

Recently, Catalyst Referred Etching (also referred to as CARE hereafter) method has been suggested (Patent Documents 3, 4).

The CARE method is conducted by causing a principal surface of a crystalline substrate such as SiC and a catalyst to be close to, or in contact with each other with a processing liquid such as an acidic liquid therebetween, and using active species produced from molecules in the processing liquid adsorbed to the catalyst, selectively removing microscopic protrusions generated as crystal defects on the principal surface by mechanical processing and polishing, to thereby achieve flattening and smoothening of the principal surface.

PRIOR ART DOCUMENTS

Patent Documents

[Patent Document 1]
Japanese Patent No. 4526547
[Patent Document 2]
Japanese Patent Application Publication 2000-330262
[Patent Document 3]
Japanese Patent No. 4506399
[Patent Document 4]
Japanese Patent Application Publication 2009-117782

SUMMARY OF THE INVENTION

The inventors of this invention recognized the following points as the problems to be solved.

In physically cleaning a photomask (transfer mask), when physical energy is intensified to sufficiently remove foreign matters, a part of a pattern may be destroyed such as by peeling (hereafter referred to as pattern destruction phenomenon). Thus, the intensity of physical cleaning force and occurrence of the pattern destruction phenomenon are in a trade-off relationship, causing a drawback in obtaining a low-defect and high-quality photomask.

The pattern destruction phenomenon not only occurs on the pattern portion, but "breaking-off phenomenon" is also observed, in which the pattern portion breaks off together with a portion of a principal surface of the substrate thereunder (hereafter referred to as "substrate-pattern integral destruction phenomenon").

Referring to FIG. 1 and FIG. 2 with megasonic cleaning as an example, explanation is made below on substrate-pattern integral destruction phenomenon by physical cleaning.

FIG. 1 is a scanning electron microscope (SEM) image showing an example of a pattern destruction of a photomask, and FIG. 2 is a schematic cross sectional view along A-A line of the photomask of FIG. 1, showing an internal structure of a pattern destruction part based on an observed result of an atomic force microscope (AFM). The horizontal axis of FIG. 2 shows the size (μm) along a longitudinal direction of the pattern portion, and the vertical axis shows the size (nm) in a thickness direction of the pattern portion.

As shown in FIG. 2, the photomask is formed on a principal surface of a synthetic quartz glass substrate, and has a pattern portion including a patterned MoSi (molybdenum/silicon) based half tone phase shift film with 75 nm film thickness. After subjecting this photomask to megasonic cleaning, the cleaning effect was observed using SEM, and a recess where a part of the pattern portion is lacking (so-called white defects) was observed as shown in FIG. 1. The recess was further observed using AFM, confirming that, as shown in FIG. 2, the recess was a concave defect with a maximum depth of 140 nm including a pattern lacking portion formed by a part of the pattern portion being peeled off from the substrate principal surface and a substrate lacking portion with a depth of 65 nm formed by a part of the principal surface exposed within the pattern lacking portion being broken off.

In observing the pattern portion thus destructed, for example, a part of the pattern portion is broken off together with the principal surface of the substrate therebeneath in most cases, as in the recess described above (substrate-pattern integral destruction phenomenon). Therefore, the substrate-pattern integral destruction phenomenon is inferred as caused by fragility of the substrate due to reduction of mechanical strength caused by the presence of machining-affected portions that is likely to occur on a part of the principal surface or inside thereof resulted from surface processing such as polishing for enhancing flatness of the principal surface of the substrate.

Such a substrate-pattern integral destruction phenomenon is more serious than the pattern destruction phenomenon on the point that destruction occurred in the pattern portion may extend to the substrate to cause expansion of the destructed region. Further, when there exist machining-affected portions in the mask blank substrate, the substrate-pattern integral destruction phenomenon may occur only when the photomask (transfer mask) utilizing the mask blank using the substrate is to be cleaned. Therefore, removing the machining-affected portions beforehand is extremely important in manufacturing a mask blank and a transfer mask.

However, the method disclosed in Patent Document 2 cleans a photomask using hydrogen water with a slight amount of alkali added thereto, and its etching action is weak. Therefore, it is not appropriate for removing machining-affected portions that may exist on a part of a principal surface or inside thereof of a glass substrate.

Further, CARE method disclosed in Patent Documents 3 and 4 is directed to wafers such as SiC, and is not assumed for a mask blank substrate in the first place.

On the other hand, since the etching action advances isotropically in the method disclosed in Patent Document 1, dissolving and removing a desired region on the principal surface of a substrate causes increasing appearance of minute concave defects and latent flaws on the substrate surface, and as a result, increases concave defects, making it difficult to obtain a high-quality mask blank.

This invention was made to solve the above problems. The primary object of this invention is to provide a method of manufacturing a low-defect and high-quality mask blank substrate in which reduction of mechanical strength of a principal surface of a mask blank substrate is prevented by removing machining-affected portions generated by a polishing solution containing abrasive grains, and occurrence of a phenomenon where, a portion of a transfer pattern and a principal surface of the substrate therebeneath breaking off together when patterning a transfer pattern forming thin film created on the principal surface of the mask blank substrate to form a transfer mask, can be inhibited.

The second object of this invention is to provide a method of manufacturing a low-defect and high-quality mask blank in which reduction of mechanical strength of a principal surface of a mask blank substrate is prevented by removing machining-affected portions generated by a polishing solution containing abrasive grains, and occurrence of a phenomenon where, a portion of a transfer pattern and a principal surface of the substrate therebeneath breaking off together when patterning a transfer pattern forming thin film created on the principal surface of the mask blank substrate to form a transfer mask, can be inhibited.

The third object of this invention is to provide a method of manufacturing a low-defect and high-quality transfer mask with less pattern loss by inhibiting occurrence of a phenomenon where a portion of the transfer pattern and a principal surface of the substrate therebeneath breaking off together.

Means for Solving the Problems

To solve the above problems, this invention includes the following structures.

(Structure 1)

A method for manufacturing a mask blank substrate used in a mask blank with a transfer pattern forming thin film created on a principal surface of the mask blank substrate, the method comprising:

a polishing step for polishing the mask blank substrate using a polishing solution containing abrasive grains; and a Catalyst Referred Etching step subsequent to the polishing step, including contacting a processing fluid that under normal conditions does not show solubility to the principal surface of the substrate, and with a processing reference surface of a catalytic surface plate in contact with or in close proximity to the principal surface, causing the substrate and the processing reference surface to move relative to each other so as to subject the principal surface to Catalyst Referred Etching to remove machining-affected portions of the principal surface.

(Structure 2)

The method for manufacturing a mask blank substrate according to Structure 1, wherein a cleaning step is conducted for removing foreign matters attached to the principal surface, the cleaning step being conducted after removal of the polishing solution attached to the principal surface during the polishing step and before conducting the Catalyst Referred Etching step.

(Structure 3)

The method for manufacturing a mask blank substrate according to Structure 1 or 2, wherein the substrate comprises a glass material.

(Structure 4)

A method for manufacturing a mask blank by creating a transfer pattern forming thin film on a principal surface of a mask blank substrate polished using a polishing solution containing abrasive grains, comprising conducting:

a step of preparing a mask blank substrate polished using a polishing solution containing abrasive grains;

a Catalyst Referred Etching step including contacting a processing fluid that under normal conditions does not show solubility to the principal surface of the substrate, and with a processing reference surface of a catalytic surface plate in contact with or in close proximity to the principal surface, causing the substrate and the processing reference surface to move relative to each other to subject the principal surface to Catalyst Referred Etching to remove machining-affected portions of the principal surface; and a transfer pattern forming thin film creating step wherein, after the Catalyst Referred Etching step, a transfer pattern forming thin film is created on the principal surface by a sputtering method.

(Structure 5)

The method for manufacturing a mask blank according to Structure 4, wherein the substrate comprises a glass material.

(Structure 6)

The method for manufacturing a mask blank according to Structure 4 or 5, wherein at least the processing reference surface of the catalytic surface plate comprises at least one material selected from the group consisting of a transition metal selected from aluminum, scandium, titanium, vanadium, chromium, manganese, iron, cobalt, nickel, copper, zinc, yttrium, zirconium, niobium, molybdenum, technetium, ruthenium, rhodium, palladium, hafnium, tantalum, tungsten, rhenium, osmium, iridium, platinum, and gold, and an alloy including at least one of the transition metals.

(Structure 7)

The method for manufacturing a mask blank according to any one of Structures 4 to 6, wherein the processing fluid is pure water.

(Structure 8)

The method for manufacturing a mask blank according to Structure 7, wherein the substrate comprises a glass material, the processing reference surface comprises platinum, and the processing fluid is pure water.

(Structure 9)

The method for manufacturing a mask blank according to Structure 5 or 8, wherein the glass material is a synthetic quartz glass.

(Structure 10)

The method for manufacturing a mask blank according to any one of Structures 4 to 9, wherein a cleaning step is conducted for removing foreign matters attached to the principal surface, the cleaning step being conducted after removal of the polishing solution attached to the principal surface during the polishing step and before conducting the Catalyst Referred Etching step.

(Structure 11)

The method for manufacturing a mask blank according to any one of Structures 4 to 10, wherein the transfer pattern forming thin film comprises a material comprising silicon.

(Structure 12)

A method for manufacturing a transfer mask, wherein the transfer pattern forming thin film of a mask blank obtained by the method for manufacturing a mask blank according to any one of Structures 4 to 11 is patterned to form a transfer pattern on the principal surface.

(Structure 13)

A method for manufacturing a transfer mask according to Structure 12 wherein a physical cleaning is conducted after forming the transfer pattern.

(Structure 14)

A method for manufacturing a transfer mask according to Structure 12 or 13, wherein the transfer mask comprises a transfer pattern with pattern line width of 100 nm or less.

Effect of the Invention

According to the method of manufacturing a mask blank substrate according to this invention, reduction of mechanical strength of a principal surface of the mask blank substrate can be inhibited by removing machining-affected portions generated during polishing step using abrasive grains through conducting Catalyst Referred Etching step on the principal surface of the mask blank substrate. Therefore, a low-defect and high-quality mask blank substrate can be manufactured which is inhibited of occurrence of a phenomenon where a portion of a transfer pattern and the principal surface of the substrate therebeneath breaking off together during creating a transfer pattern forming thin film on the principal surface of the mask blank substrate and patterning the thin film to manufacture a transfer mask.

According to the method of manufacturing a mask blank according to this invention, by subjecting a principal surface of a mask blank substrate to the Catalyst Referred Etching step, machining-affected portions generated by polishing in the preparation step are removed so that reduction of mechanical strength of the principal surface of the mask blank substrate is inhibited, and a transfer pattern forming thin film can be created on the principal surface of the mask blank substrate. Therefore, a low-defect and high-quality mask blank can be manufactured which is inhibited of occurrence of a phenomenon where a portion of a transfer pattern and a principal surface of the substrate therebeneath breaking off together during patterning the thin film to form a transfer mask.

According to the method of manufacturing a transfer mask according to this invention, occurrence of a phenomenon where a portion of a transfer pattern and a principal surface of the substrate therebeneath breaking off together can be inhibited by patterning a transfer pattern forming thin film of the mask blank obtained by the method of manufacturing the mask blank described above. Therefore, a low-defect and high-quality transfer mask with less pattern loss can be manufactured.

MODE FOR CARRYING OUT THE INVENTION

Embodiment 1

Figure 1:
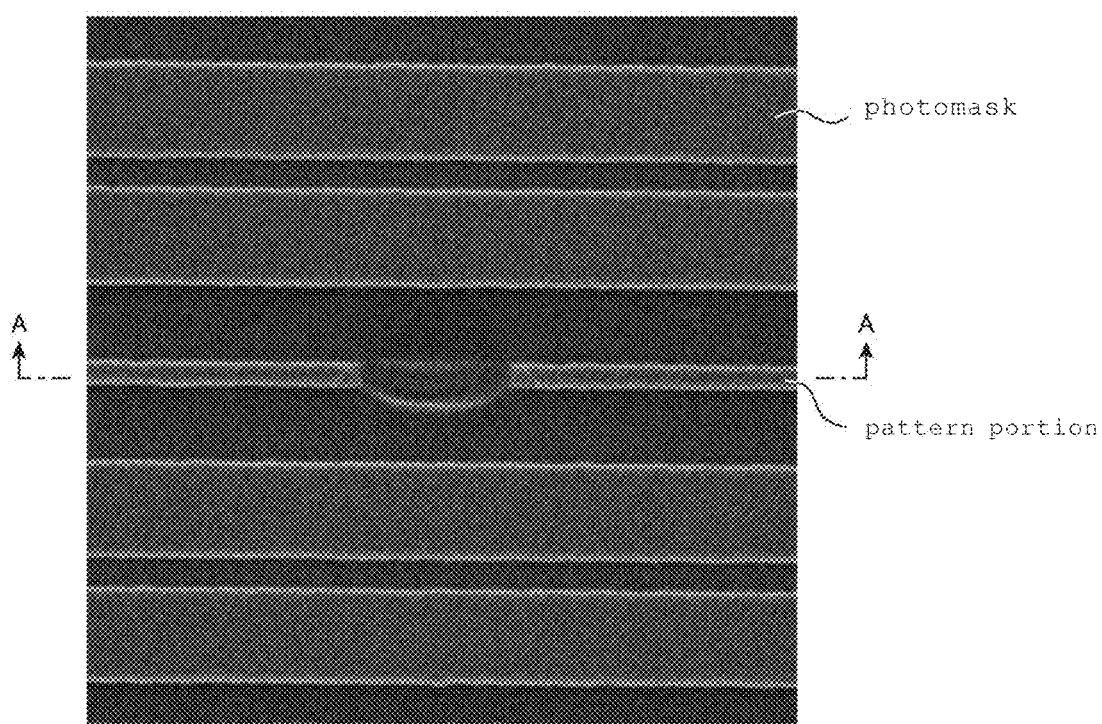
FIG. 1 is a scanning electron microscope (SEM) image showing an example of pattern destruction of a photomask occurred due to megasonic cleaning.

In the manufacturing method of a mask blank substrate according to Embodiment 1 of this invention, a mask blank substrate is manufactured by conducting a polishing step in which a principal surface of a mask blank substrate is polished using a polishing solution containing abrasive grains; and conducting a Catalyst Referred Etching step in which, subsequent to the polishing step, contacting a processing fluid that under normal conditions does not show solubility to the principal surface of the substrate, and with a processing reference surface of a catalytic surface plate in contact with or in close proximity to the principal surface, causing the substrate and the processing reference surface to move relative to each other to subject the principal surface to Catalyst Referred Etching to remove machining-affected portions of the principal surface (hereafter referred to as CARE step).

<Polishing Step>

Materials constructing the mask blank substrate prepared in this embodiment include glass materials such as glass ceramics and glass such as synthetic quartz glass, soda-lime glass, borosilicate glass, aluminosilicate glass, and $SiO_2$—$TiO_2$ based glass, which are selected arbitrarily in accordance with the purpose or use conditions of the substrate. For example, as glass materials used for a transmissive mask blank mentioned below, materials that are transmissive to exposure wavelength to be used should be selected. For example, synthetic quartz glass is preferable as a substrate material for ArF excimer laser exposure.

A mask blank to which this invention can be applied includes, for example, a transmissive mask blank such as a binary mask blank and a phase shift mask blank, and a nanoimprint mask blank (Example 4 mentioned below).

The binary mask blank includes a binary mask blank having, for example, MoSi (molybdenum/silicon) based (Example 2 below), Ta (tantalum) based (Example 3 below), and Cr (chromium) based transfer pattern forming thin film created on a principal surface of a mask blank substrate.

Further, the phase shift mask blank includes various types of phase shift mask blanks, for example, half tone type (Example 1 below), Levenson type, and chromeless type.

However, these mask blanks are merely for examples, which should not be limited thereto in this invention, and application to other types of mask blanks is possible.

To satisfy the specification of the surface form of the substrate required according to the use of the substrate, the principal surface of such a substrate is subjected to polishing (polishing step) such as CMP polishing for the purpose of controlling flatness and smoothness of the principal surface. Polishing method to control flatness and smoothness is mentioned below.

Polishing step is for subjecting a principal surface of a mask blank substrate to polishing using a polishing solution containing abrasive grains. Abrasive grains used in the polishing step include cerium oxide, zirconium oxide, silica, colloidal silica, etc.

Polishing step can include multiple stages achieving desired surface roughness and flatness, for example, two stages including rough polishing step and precision polishing step; three stages including rough polishing step, precision polishing step, and superprecision polishing step; and even four or more stages. In the case of conducting polishing step of multiple stages, by reducing the size of abrasive grains as the polishing step proceeds, surface roughness of the substrate principal surface can be reduced.

In the polishing step of a plurality of stages, colloidal silica is preferably used as abrasive grains to be used in the polishing step of the final stage. In the combination with CARE step conducted after the polishing step, it is preferable to minimize concave defects such as pits on the principal surface of the mask blank substrate to be introduced to CARE step. This is because, in CARE step, since the principal surface of the substrate is processed with processing reference surface of a catalytic surface plate as the standard surface, the projections existing on the principal surface of the substrate are preferentially processed, so that concave defects such as pits are likely to remain; or to eliminate concave defects, machining allowance in CARE step should be enlarged. Enlarging machining allowance in CARE step in unfavorable for causing longer processing time of CARE step thus leading to higher production cost. For the purpose of minimizing concave defects such as pits, chemically modified colloidal silica is preferably used as the abrasive grains. The polishing liquid containing colloidal silica preferably includes an additive and alkali compound in addition to water. In addition to coating the abrasive grain surface, an additive can inhibit attacking of the abrasive grains on the polishing surface for protecting the polishing surface, so that concave defects such as pits can be inhibited. Preferably, the additive is at least a type selected from hydroxyethyl cellulose, hydroxypropyl cellulose, polyvinyl alcohol, polyvinylpyrrolidone, and prolan. Two or more of the above can be used in combination. Considering cleaning property, hydroxyethyl cellulose is preferable among these additives. The alkali compounds include ammonia, tetramethyl ammonium hydroxide, tetraethyl ammonium hydroxide, and tetrabutyl ammonium hydroxide, among which ammonia is preferable. Particle size of the abrasive grains is determined arbitrarily in accordance with desired surface roughness.

After the polishing step, a cleaning step is normally conducted to remove the used abrasive grains from the substrate principal surface. In addition to pure water, acidic aqueous solution and alkaline aqueous solution can be used in the cleaning step to effectively remove abrasive grains from the principal surface of the substrate.

Polishing such as by CMP polishing is a processing method for obtaining a desired flatness and smoothness by mainly polishing convex parts of the substrate principal surface using a polishing pad and a polishing solution containing abrasive grains such as cerium oxide and colloidal silica as stated above, and controlling the abrasive grain size, processing pressure, processing time, etc.

During such polishing, when a polishing jig such as a polishing pad and abrasive grains contact the principal surface of the mask blank substrate and processing pressure is applied to the principal surface, it is inferred that, for example, the abrasive grains scratching the principal surface cause scratches and microscopic latent defects (latent defects such as flaws and cracks) to remain on or in the principal surface as machining-affected portions.

<CARE Step>

CARE step is a surface processing step for the purpose of removing machining-affected portions that may be present on or in the substrate principal surface due to the polishing to inhibit reduction of mechanical strength of the substrate, while maintaining flatness of the principal surface obtained in the above mentioned polishing, and also for enhancing smoothness of the principal surface, conducted by contacting a processing fluid to the principal surface of a polished substrate, and with a processing reference surface of a catalytic surface plate in contact with or in close proximity to the principal surface, causing the substrate and the processing reference surface to move relative to each other to subject the principal surface to CARE by active species produced from molecules in the processing liquid adsorbed to the processing reference surface.

Since the principle of the surface processing in CARE step is a chemical reaction and not a mechanical polishing, damage on the substrate principal surface is considered to be extremely low.

The active species, which are products of chemical reaction in CARE step, are produced only on the processing reference surface, and have a characteristic of immediately deactivating once the active species are away from the processing reference surface. Thus, since the active species can be acted upon only on a desired region on the principal surface of the substrate to which the processing reference surface is in close proximity to or in contact with, CARE can be conducted limitedly on the desired region to remove the machining-affected portions. On the other hand, since the active species are not acted upon an external area of the desired region, for example, on the region where CARE has already been completed, excessively deep removal of the principal surface of the external area can be inhibited.

Further, since the active species are produced from the molecules in the processing fluid under the presence of catalyst of the catalytic surface plate and hardly generates unfavorable, unpredictable side reactions, flatness of the principal surface obtained by the polishing can be maintained, and smoothness can be enhanced by reducing surface roughness of the substrate principal surface.

Before CARE step, for example, machining-affected portion depth that varies in accordance with the types of polishing method in the above polishing process is assumed beforehand, and a machining allowance required to remove the principal surface up to the assumed depth is arbitrarily set. For example, for a substrate subjected to CMP polishing as precision polishing using a polishing solution containing colloidal silica, the machining allowance can be set, for example, in the range between 1 nm and 500 nm so as not to remove excess principal surface.

Control methods for ensuring a determined machining allowance include, for example, for a mask blank substrate prepared separately beforehand, previously determining the relationship between the machining allowance and the processing time and various CARE processing conditions (processing pressure, number of revolutions, processing liquid flow rate), determining CARE processing condition and processing time to achieve a desired machining allowance, and controlling the processing time, to thereby control the machining allowance. However, the methods are not limited thereto, but various methods can be selected as long as the machining allowance is ensured as previously set.

CARE step is explained below with reference to one example of a mask blank substrate processing device (hereafter referred to as substrate processing device).

Figure 3:
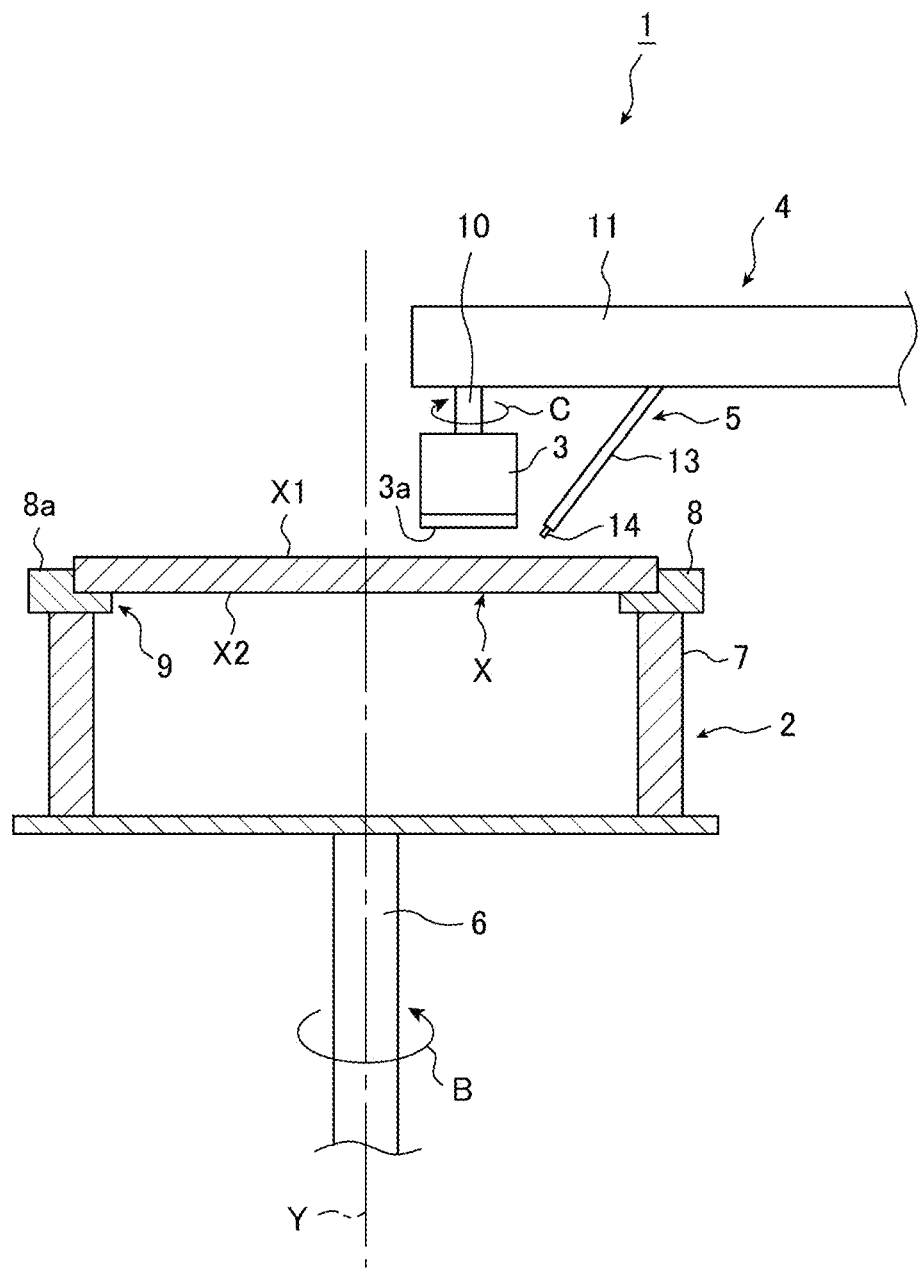
FIG. 3 is a partial cross-sectional view showing a structure of an example of a mask blank substrate processing device that can be subjected to CARE in the method of manufacturing the mask blank according to this invention.
Figure 4:
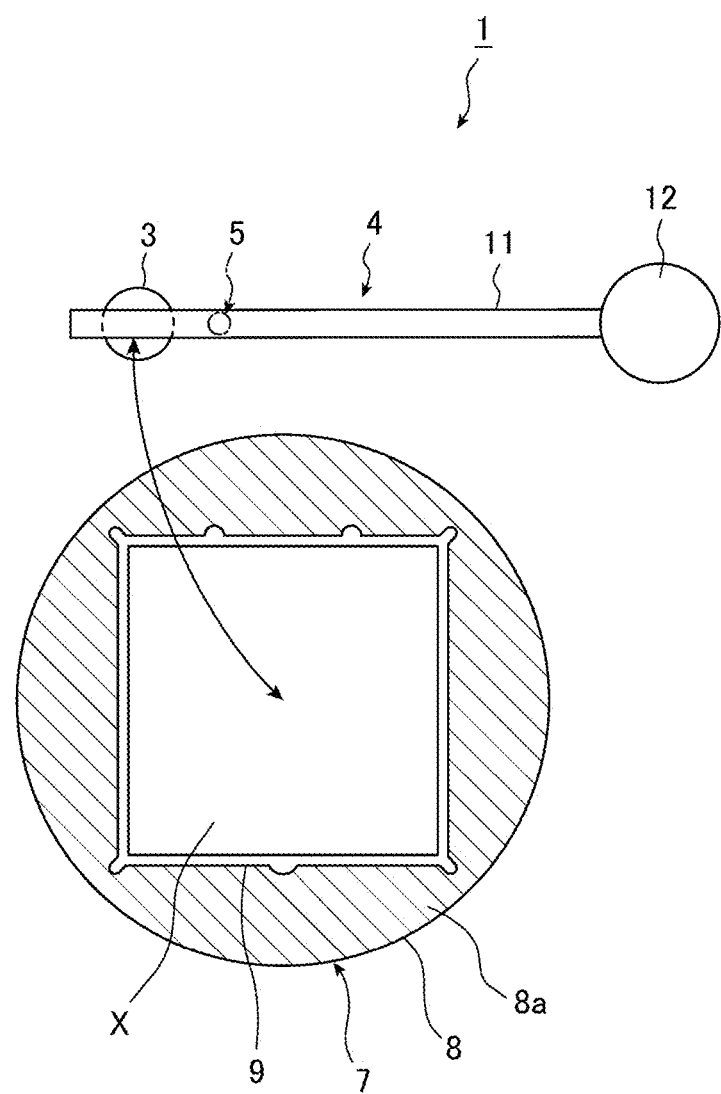
FIG. 4 is a plan view of the structure of the mask blank substrate processing device of FIG. 3 partially shown in section.

As shown in FIG. 3 and FIG. 4, a substrate processing device 1 is a sheet-type device for conducting CARE on a single piece of substrate X, including a substantially cylindrical chamber (not shown) for receiving substrate X, the chamber (not shown) including therein substrate support means 2 for supporting substrate X; a catalytic surface plate 3 circular in plan view having a processing reference surface 3a placed facing a principal surface X1 of substrate X; relative movement means 4 for causing processing reference surface 3a of catalytic surface plate 3 and principal surface X1 of substrate X to move relative to each other in contact with or in close proximity to; and processing fluid supply means 5 for supplying a processing fluid for subjecting principal surface X1 to CARE.

As shown in FIG. 3 for example, substrate X housed in the chamber (not shown) and supported horizontally by the substrate support means (not shown) includes first principal surface X1 to which a transfer pattern forming thin film is created (i.e., front surface) and a second principal surface X2 to which a transfer pattern forming thin film is not created (i.e., rear surface).

Substrate support means 2 includes a rotating axis 6 provided to stand vertically from below along vertical axis Y and a rotating body 7 with closed-end cylindrical shape fixed at an upper end of rotating axis 6. Rotating axis 6 is for rotation about vertical axis Y as a rotational center in the direction of, e.g., arrow B, by a driving device (not shown). Together with the rotation of rotating axis 6, rotating body 7 fixed to rotating axis 6 also rotates in an integral manner.

Provided on an upper edge portion of rotating body 7 is a substrate support portion 8 for supporting substrate X. As shown in FIG. 4, substrate support portion 8 is in the shape of a disk in plan view, with a substrate receiving portion 9, rectangular in plan view, formed in the central portion for receiving substrate X. The rotational center (vertical axis Y) of rotating body 7 and the center of substrate X received in substrate receiving portion 9 (intersection of two diagonal lines of principal surface X1) are arranged coaxially. As shown in FIG. 3, substrate receiving portion 9 is substantially L-shaped in cross section, and substrate X is placed on its horizontal surface in contact with four band-like peripheral regions of second principal surface X2 (outer peripheral region external of the rear surface side region corresponding to the region where the transfer pattern forming thin film is to be created on first principal surface X1 of substrate X).

Provided on an attachment portion (not shown) of catalytic surface plate 3 are an air cylinder (not shown) to apply load to catalytic surface plate 3 and a load cell (not shown) for measuring the load applied to catalytic surface plate 3 by the air cylinder and switching an air valve on or off to prevent exceeding of a predetermined load to control the load applied to catalytic surface plate 3 by the air cylinder. The processing pressure in conducting CARE is controlled by these means.

Processing reference surface 3a of catalytic surface plate 3 is formed by creating a film of catalyst on a pad that is circular in plan view for example, the pad being provided on the bottom of catalytic surface plate 3 as shown in FIG. 3 and FIG. 4 for example. While the area of processing reference surface 3a of this example is formed smaller than the area of principal surface X1 of substrate X, this is by no means a limitation but the area can be identical to the area of principal surface X1, or larger than the area of principal surface X1.

There is no particular limitation for the material forming the pad as long as the pad can reliably hold processing reference surface 3a, which can be selected arbitrarily from various materials including, for example, rubber, light-transmissive resin, foaming resin, nonwoven fabric, etc.

Materials forming at least processing reference surface 3a of catalytic surface plate 3 include at least one material selected from the group consisting of a transition metal selected from, for example, aluminum, scandium, titanium, vanadium, chromium, manganese, iron, cobalt, nickel, copper, zinc, yttrium, zirconium, niobium, molybdenum, technetium, ruthenium, rhodium, palladium, hafnium, tantalum, tungsten, rhenium, osmium, iridium, platinum, and gold, and an alloy including at least one metal among the transition metals (SUS (stainless steel), etc.), and a ceramic based solid catalyst. Such materials constituting processing reference surface 3a are preferably selected arbitrarily in combination with a material constituting substrate X or a processing fluid mentioned below.

As shown in FIG. 3 for example, processing reference surface 3a is configured to rotate by catalytic surface plate 3 being rotatably supported by a rotating axis 10 rotated by a driving device (not shown). Rotating axis 10 is supported at the lower face at the tip end side of an arm 11, a proximal end of arm 11 is horizontally supported by a pivot axis 12 that pivots by a driving device (not shown), and arm 11 is configured to pivot about pivot axis 12 between a standby position shown in FIG. 4 and a position of which processing reference surface 3a of catalytic surface plate 3 supported by arm 11 reaches the center of substrate X. This pivot allows processing reference surface 3a to move horizontally throughout principal surface X1 of substrate X rotated by substrate support means 2.

In substrate processing device 1 of this embodiment, rotating axis 10 and the driving device (not shown) of rotating axis 10 constitute one horizontal moving means in relative movement means 4; and arm 11, pivot axis 12, and the driving device (not shown) for its pivoting constitute other horizontal moving means in relative movement means 4. However, these are not for limitation but other known means can be used for horizontal moving means of processing reference surface 3a.

Further, as vertical moving means of relative movement means 4, adjusting means (not shown) can be provided for adjusting relative distance between processing reference surface 3a and principal surface X1 of substrate X for adjusting, for example, the height of at least one of substrate X and processing reference surface 3a. The relative distance is determined arbitrarily in conducting CARE, under the premise that a processing fluid is present between principal surface X1 and processing reference surface 3a.

Relative movement means 4 including the horizontal moving means and vertical moving means as above can be provided with, for example, control means (not shown) such as an arithmetic device for controlling both horizontal moving means and vertical moving means for relative movement thereof.

At this stage, the rotating direction of catalytic surface plate 3 (e.g., direction of arrow C) and the rotating direction of substrate X (e.g., direction of arrow B) are set to be opposite. This is for enhancing efficiency of CARE by reversely rotating to assure peripheral speed difference therebetween. Their numbers of revolutions are set to slightly differ, achieving relative movement in which processing reference surface 3a of catalytic surface plate 3 draws a different trajectory on principal surface X1 of substrate X for enhanced CARE efficiency.

The numbers of revolutions of substrate X and processing reference surface 3a are set within the range between, e.g., 5 rpm to 200 rpm, respectively. Further, processing time is set within the range between, e.g., 5 and 120 minutes. Moreover, processing pressure applied as desired is arbitrarily adjusted within the range between, e.g., 0 hPa and 1000 hPa, and preferably between 10 hPa and 1000 hPa.

Processing fluid supply means 5 includes a supply tube 13 extending obliquely downward from a bottom face of arm 11 toward catalytic surface plate 3, and an injection nozzle 14 provided at a tip of a bottom end of supply tube 13 for injecting processing fluid toward processing reference surface 3a of catalytic surface plate 3. Supply tube 13 passes through, e.g., inside of arm 11, and is connected to a processing fluid reservoir tank (not shown) and a compression pump (not shown).

A fluid that under normal conditions does not show solubility on substrate X is selected as the processing fluid supplied from injection nozzle 14 of processing fluid supply means 5. For example, in forming substrate X from a glass material, at least one liquid selected from the group consisting of, for example, pure water, functional water such as ozone water and hydrogen water, low concentration alkaline aqueous solution, and low concentration acidic aqueous solution can be used.

Further, in the case when materials forming substrate X is insoluble in the normal state by a processing liquid containing dissolved molecules including halogen (hereafter referred to as halogen-containing processing liquid), the halogen-containing processing liquid can be used. While hydrogen halide is preferable as molecules including halogen contained in this halogen-containing processing liquid, molecules having bonds of C—F, S—F, N—F, C—Cl, S—Cl, N—Cl, etc. can also be used.

Halogen in an aqueous solution containing dissolved molecules of hydrogen halide (hydrohalic acid) includes, for example, fluorine (F), chlorine (Cl), bromine (Br), and iodine (I). Since chemical reactivity generally becomes smaller as atomic number becomes larger, considering actual processing rate of the processing fluid, hydrofluoric acid (HF aqueous solution) can preferably be selected as a processing fluid containing halogen.

In the case where concentration of halogen content is high, for example, glass ($SiO_2$) that may be selected as a substrate material may be dissolved in HF aqueous solution, or titanium (Ti) included in a low expansion glass may be selectively eluted in HCl aqueous solution. Therefore, in using hydrohalic acid as a processing fluid, its reactivity on substrate X and conditions such as processing time should be considered arbitrarily so as to adjust to a concentration suitable to sufficiently remove machining-affected portions that may be present in principal surface X1, etc. of substrate X.

In CARE step, for example, synthetic quartz glass and $SiO_2$—$TiO_2$ based glass suitable for a mask blank substrate that can manage shorter wavelength of exposure light can be used as a component of substrate X, platinum having superior anticorrosion property can be used as a component of processing reference surface 3a, and pure water that is advantageous in view of cost can be used as a processing fluid. This combination is superior in processing property on selectively removing minute protrusions on principal surface X1 of substrate X, reducing surface roughness of principal surface X1, and enhancing smoothness.

In the case of this combination, it is considered that hydroxyl group in pure water on processing reference surface 3a produces active species on processing reference surface 3a, and hydrolysis reaction proceeds in which the active species selectively bind to silicon of minute protrusions on principal surface X1 in close proximity to or in contact with processing reference surface 3a to create lysate (silicon oxide) in pure water, thus the minute protrusions can be selectively removed.

Thus, according to this embodiment, by CARE step, reduction of mechanical strength of substrate X can be inhibited by sufficiently removing the machining-affected portions on or in principal surface X1 and at the same time smoothness of principal surface X1 can be enhanced, while maintaining the flatness of principal surface X1 of substrate X obtained by polishing step. Therefore, a low-defect and high-quality mask blank substrate can be manufactured which is inhibited of the occurrence of a phenomenon where a part of a transfer pattern forming thin film created in the following film forming step is peeled off.

Embodiment 2

In the manufacturing method of a mask blank according to Embodiment 2 of this invention, a mask blank is manufactured by conducting a preparation step of a mask blank substrate (hereafter referred to as preparation step), a subsequent CARE step, and a subsequent step for creating a transfer pattern forming thin film (hereafter referred to as film forming step).

Explanation is made below for each step.

<Preparation Step>

Preparation step is for preparing a mask blank substrate with its principal surface polished before conducting the following CARE step and thin film forming step.

This preparation step is for preparing a mask blank substrate polished using a polishing solution containing abrasive grains through the polishing step, etc. explained above in Embodiment 1.

<CARE Step>

This step is for removing machining-affected portions of a principal surface of a mask blank substrate formed in the polishing (polishing step) by conducting CARE step explained above in Embodiment 1.

<Film Forming Step>

Film forming step is to form a transfer pattern forming thin film by sputtering method on principal surface X1 of substrate X after conducting CARE step mentioned above.

Known sputtering methods such as reactive sputtering (DC sputtering) and magnetron sputtering can be selected arbitrarily. Sputtering conditions such as sputtering gas and sputtering pressure are selected arbitrarily in accordance with an intended use of the mask blank and components of the transfer pattern forming thin film.

The structure of a transfer pattern forming thin film is determined arbitrarily considering the intended use of the mask blank and properties on exposure light. In the case of a half tone phase shift mask blank (e.g., Example 1 mentioned below), a structure including, for example, a light-semitransmissive film formed on principal surface X1 and light shielding film formed thereon (light shielding layer and front-surface antireflection layer) can be selected. Further, in the case of a binary mask blank (e.g., Example 2 and Example 3 mentioned below), a structure including, for example, a light shielding film on principal surface X1 (light shielding layer and front-surface antireflection layer, or back-surface antireflection layer, light shielding layer and front-surface antireflection layer) can be selected.

Materials forming the transfer pattern forming thin film are selected arbitrarily from materials that can be formed into a film by sputtering method, and which satisfy the properties required for the intended mask blank, for example, materials including silicon (Si) are preferably selected. As examples of materials containing silicon (Si), those containing silicon and oxygen and/or nitrogen (e.g., SiN, SiON, SiO, SiCO, SiCON), and materials containing transition metal and silicon (e.g., MSi, MSiN, MSiON, MSiO, MSiCO, MSiCON (M=transition metal)) are given, without limitation. For transition metals as film components, Mo (molybdenum), tantalum (Ta), tungsten (W), nickel (Ni), titanium (Ti), etc. can be used. Particularly, as transition metals used together with silicon, molybdenum can be preferably selected such as a MoSi based mask blank. Further, as transition metals used together with oxygen or nitrogen, tantalum can be selected as in tantalum nitride and tantalum oxide in Ta based mask blank, for example. Furthermore, as transition metals used together with oxygen and nitrogen, chromium can be selected as in, e.g., CrOCN in Cr based mask blank, and e.g., CrN as a transition metal used together with nitrogen.

Better adhesiveness of substrate X and the thin film is achieved in a mask blank in which a material containing silicon (Si) is selected as a component of a transfer pattern forming thin film and a glass such as synthetic quartz glass is selected as a component of substrate X. If machining-affected portions remain on or in principal surface X1 of substrate X of the mask blank, the machining-affected portions cause reduction of mechanical strength of substrate X, which may cause substrate-pattern integral destruction phenomenon when the thin film is subjected to physical cleaning. However, by sufficiently removing the machining-affected portions of the principal surface X1 of substrate X through the CARE step and inhibiting reduction of mechanical strength of substrate X, occurrence of substrate-pattern integral destruction phenomenon can be inhibited.

While CARE step was explained in Embodiments 1 and 2 with reference to the substrate processing device shown in FIG. 3 and FIG. 4, the substrate processing device can be applied to CARE step in the manufacturing method of a mask blank substrate and a manufacturing method of a mask blank of the embodiments explained below.

The substrate processing device given above is one example suitable for CARE step, which is not limited thereto. For example, the device can have a structure of conducting CARE step and other steps (e.g., polishing in preparation step, cleaning step before and/or after CARE step conducted as necessary) in the same chamber (not shown). Since transfer of substrate X between each step can be omitted with a device of such a structure, the amount of foreign matters to be attached to principal surface X1 of substrate X can be reduced.

As stated above, according to this embodiment, by CARE step, reduction of mechanical strength of substrate X can be inhibited by sufficiently removing the machining-affected portions on or in principal surface X1 and at the same time smoothness of principal surface X1 can be enhanced, while maintaining the flatness of principal surface X1 of substrate X obtained by polishing in the preparation step. Therefore, a low-defect and high-quality mask blank can be manufactured in which an occurrence of peeling of apart of a transfer pattern forming thin film created in the subsequent film forming step is inhibited.

Embodiments 3, 4

The method of manufacturing a mask blank substrate according to Embodiment 3 and the method of manufacturing a mask blank according to Embodiment 4 of this invention differ from Embodiment 1 and Embodiment 2 in that in Embodiments 3 and 4, cleaning step for removing foreign matters attached to principal surface X1 of substrate X is conducted after removing abrasive grains attached to principal surface X1 of substrate X in the polishing step or polishing during the preparation step, and before conducting CARE step.

In this cleaning step, new foreign matters may attach to principal surface X1 of substrate X before CARE step, even if abrasive grains were removed in the preparation step. When the new foreign matters become caught between principal surface X1 and processing reference surface 3a in CARE step and cause flaws on both surfaces, not only is the purpose of CARE step achieved, but it also causes substrate X and processing reference surface 3a to be unusable. This step is for preventing beforehand the occurrence of such a disadvantage.

There is no particular limitation for the cleaning step before CARE step, as long as the step exhibits an effect for sufficiently removing the new foreign matters, and a known physical cleaning method, chemical cleaning method, and combination thereof can be used. The physical cleaning methods include a known cleaning method using physical cleaning tools such as a megasonic nozzle, double fluid nozzle, and brush to apply physical action on the foreign matters for their removal. Further, the chemical cleaning methods include a known cleaning method in which foreign matters are lifted off using chemical cleaning tools such as APM (ammonium hydrogen peroxide mixture) and SPM (sulfuric acid hydrogen peroxide mixture).

Thus, according to this embodiment, since foreign matters attached to principal surface X1 of substrate X before CARE step can be sufficiently removed by cleaning step, flaws on principal surface X1 and processing reference surface 3a caused by foreign matters caught between substrate X and processing reference surface 3a during CARE step can be prevented. Thus, mask blank defects caused by flaws formed on the substrate principal surface can be inhibited, so that a low-defect and high-quality mask blank substrate, and a low-defect and high-quality mask blank can be manufactured.

Embodiments 5, 6

The method of manufacturing a mask blank substrate according to Embodiment 5 and the method of manufacturing a mask blank according to Embodiment 6 of this invention differ from Embodiments 1 to 4 in that in Embodiments 5 and 6, surface processing is conducted before CARE step to control flatness of principal surface X1 of substrate X.

The surface processing can be conducted before or after the polishing step, or before or after the polishing in the preparation step.

Known methods can be used for the process of controlling flatness that can be applied to the surface processing in these embodiments. For example, magneto rheological finishing: MRF, local chemical mechanical polishing (local CMP), gas cluster ion beam etching: GCIB, dry chemical planarization using local plasma etching: local DCP can be selected arbitrarily.

MRF is a local processing method for locally polishing substrate X by rapidly contacting abrasive grains contained in a magnetic fluid on substrate X and controlling the residence time of the contact portion.

Local CMP is a local processing method mainly polishing convex portions on principal surface X1 of substrate X using a small-diameter polishing pad and a polishing liquid containing abrasive grains such as colloidal silica and controlling the residence time of the contact portion of the small-diameter polishing pad and substrate X.

In the surface processing using abrasive grains, for the purpose of minimizing concave defects such as pits from the principal surface of the substrate, chemically modified colloidal silica is preferably used as colloidal silica for use as abrasive grains. The polishing liquid containing colloidal silica preferably includes an additive and alkali compound in addition to water. In addition to coating the abrasive grain surface, an additive can inhibit attacking of the abrasive grains on the polishing surface by protecting the polishing surface, so that concave defects such as pits can be inhibited. Preferably, the additive is at least a type selected from hydroxyethyl cellulose, hydroxypropyl cellulose, polyvinyl alcohol, polyvinylpyrrolidone, and prolan. Two or more of the above can be used in combination. Considering cleaning property, hydroxyethyl cellulose is preferable among these additives. The alkali compounds include ammonia, tetramethyl ammonium hydroxide, tetraethyl ammonium hydroxide, and tetrabutyl ammonium hydroxide, among which ammonia is preferable.

GCIB is a local processing method in which a reactive substance (source gas) in the form of gas at normal temperature and pressure is adiabatically expanded and ejected in a vacuum device to form a gas cluster, the gas cluster is ionized by subjecting to electronic irradiation, the gas cluster ion thus formed is accelerated in high electrical field into a gas cluster ion beam, and the beam is irradiated onto substrate X for etching.

Local DCP is a local processing method in which local plasma etching is conducted and the plasma etching amount is controlled in accordance with a degree of convex, to thereby locally conduct dry etching.

As stated above, according to the present embodiments, flatness of principal surface X1 of substrate X can be controlled, or smoothness can be improved while maintaining possible flatness by surface processing before CARE step. As a result, CARE step can be conducted on principal surface X1 of substrate X having excellent flatness and/or smoothness, so that machining-affected portions on or in principal surface X1 can be efficiently removed, and a low defect, high quality mask blank can be manufactured in which occurrence of peeling of a transfer pattern forming thin film created in subsequent film forming step is inhibited.

Embodiment 7

In the method of manufacturing a transfer mask according to Embodiment 7 of this invention, the transfer mask is manufactured by patterning a transfer pattern forming thin film of the mask blank obtained by the method of manufacturing a mask blank according to any one of Embodiments 2, 4, and 6 by a known lithography technique, and forming a transfer pattern on principal surface X1.

Pattern line width of a transfer pattern is determined arbitrarily according to the purpose, etc. required for the intended transfer mask. For example, in the semiconductor design rule after 36 nm half pitch (hp) of DRAM application, for example, pattern line width of 100 nm or less may be used for the transfer pattern for ¼ reduction projection. This invention is most effective in the method of manufacturing a transfer mask having a transfer pattern with a pattern line width of 100 nm or less.

Since reduction of mechanical strength of substrate X is inhibited in the transfer mask manufactured in this embodiment, even if the pattern line width of the transfer pattern is formed smaller, there is less chance of pattern loss caused by a part of the transfer pattern being peeled off.

On the surface of the transfer pattern as mentioned above, physical cleaning can be conducted to remove foreign matters attached to the surface by applying physical action on the foreign matters. In the physical cleaning, known physical cleaning tools can be used including the above-mentioned megasonic nozzle, double fluid nozzle, and brush. As a cleaning solution used in this physical cleaning, at least one liquid selected from the group consisting of liquids such as pure water, functional water such as ozone water and hydrogen water, and neutral detergent (including surfactant and chelating agent) can be used. Through such a physical cleaning, even if relatively large physical action is applied to the transfer pattern surface, pattern destruction phenomenon and substrate-pattern integral destruction phenomenon of the transfer pattern are unlikely to occur, since reduction of the mechanical strength of substrate X is inhibited as stated above.

In addition to the physical cleaning, cleaning process such as chemical cleaning using known chemical cleaning tools such as APM (ammonium hydrogen-peroxide mixture) and SPM (sulfuric acid hydrogen peroxide mixture) and RCA cleaning can be conducted as necessary. However, the chemical action is preferably controlled to avoid affecting the film property of the transfer pattern of the transfer mask and the smoothness of principal surface X1 of substrate X.

Thus, according to this embodiment, since occurrence of a phenomenon where apart of the transfer pattern and principal surface X1 of substrate X therebeneath breaking off together can be inhibited by patterning a low-defect and high-quality mask blank, a low-defect and high-quality transfer mask with less pattern loss can be manufactured.

EXAMPLES

Example 1

(Manufacture of Mask Blank Glass Substrate, ArF Excimer Laser Exposure Half Tone Phase Shift Mask Blank, and Half Tone Phase Shift Mask)
(Polishing Step, Preparation Step)
(1) First Polishing (Rough Polishing) Step As a light-transmissive substrate, 6025 synthetic quartz glass substrate (152.4 mm×152.4 mm×6.35 mm thickness)

was used. Ten glass substrates, with end surfaces chamfered and ground, were placed in a double side polishing device, and rough polishing was conducted under the following polishing condition. Sets of glass substrates each including ten substrates were rough-polished five times, with a total of fifty glass substrates. Processing load and polishing time were adjusted arbitrarily.

slurry: aqueous solution containing cerium oxide (average particle size 2 to 3 μm)
polishing pad: hard polisher (urethane pad)

After the above polishing step, to remove abrasive grains attached to the glass substrate, the glass substrate was cleaned by applying ultrasonic wave while immersed in a cleaning bath.

(2) Second Polishing (Precision Polishing) Step

Ten glass substrates that went through the first polishing were placed in a double side polishing device, and precision polishing was conducted under the following polishing condition. Sets of glass substrates each including ten substrates were precision-polished five times, with a total of fifty glass substrates. Processing load and polishing time were adjusted arbitrarily.

slurry: aqueous solution containing cerium oxide (average particle size 1 μm)
polishing pad: soft polisher (suede type)

After the polishing step, to remove abrasive grains attached to the glass substrate, the glass substrate was cleaned by applying ultrasonic wave while immersed in a cleaning bath.

(3) Third Polishing (Superprecision Polishing) Step

Ten glass substrates that went through the second polishing were placed in a double side polishing device, and super-precision polishing was conducted under the following polishing condition. Sets of glass substrates each including ten substrates were superprecision-polished five times, with a total of fifty glass substrates. Processing load and polishing time were adjusted arbitrarily.

slurry: alkaline aqueous solution (pH10.2) containing colloidal silica (average particle size 100 nm)
polishing pad: super-soft polisher (suede type)

After the superprecision polishing step, the glass substrate was cleaned by applying ultrasonic wave while immersed in a cleaning bath containing cleaning solution including an alkaline aqueous solution of sodium hydroxide.

(CARE Step)

Next, CARE was conducted only on the principal surface to which a transfer pattern forming thin film is created on the glass substrate that went through the multiple stages of polishing step as mentioned above.

Figure 2:
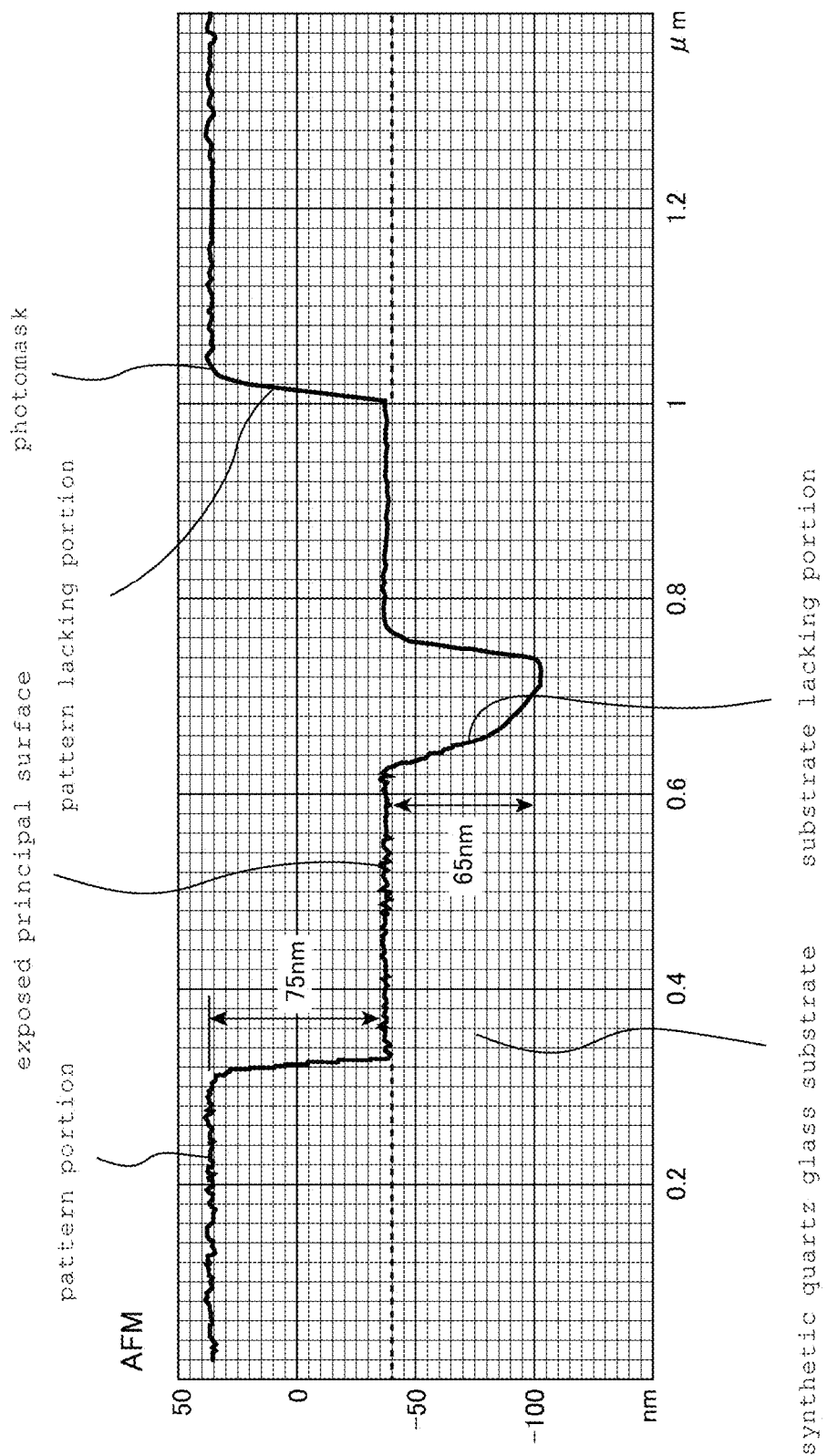
FIG. 2 is a cross sectional view schematically showing an internal structure of pattern destruction portion based on an observation result using atomic force microscope (AFM) of a cross section taken along line A-A of the photomask of FIG. 1.

The machining allowance in CARE step is set at 100 nm based on the depth of 65 nm of substrate lacking part measured by AFM shown in FIG. 2.

Pure water was used as the processing fluid, and a processing reference surface including platinum was used. The glass substrate and the catalytic surface plate were rotated in a reverse manner, number of revolutions of the glass substrate was set at 10.3 rpm, and number of revolutions of the catalytic surface plate was set at 10 rpm. Processing pressure applied to the glass substrate principal surface during processing was set at 250 hPa.

Next, after the above CARE step, end faces of the glass substrate were scrub-cleaned, the glass substrate was immersed in a cleaning bath containing aqua regia (temperature: about 65° C.) for about 10 minutes, and thereafter rinsed with pure water and dried.

Thus, a mask blank glass substrate was obtained.

The surface roughness of the principal surface of the glass substrate obtained by completion of the above CARE step was measured using AFM (atomic force microscope), showing a good result of 0.09 nm at Rms (root mean square surface roughness).

(Film Forming Step)

Next, a half tone phase shift mask blank was manufactured by forming a single layer light-semitransmissive film including molybdenum (Mo), silicon (Si), and nitrogen (N) by DC sputtering method as a transfer pattern forming thin film on the glass substrate that went through the above substrate processing.

Namely, reactive sputtering (DC sputtering) was conducted using a mixed target of molybdenum (Mo) and silicon (Si) (atomic % ratio, Mo:Si=8:92) under a mixed gas atmosphere of argon (Ar), nitrogen ($N_2$), and oxygen ($O_2$) to form a light-semitransmissive film (film composition (atomic %) Mo:Si:O:N=5:30:39:26, film thickness: about 880 angstrom) including oxynitrided molybdenum silicide (MoSiON) on the glass substrate. Composition analysis of the light-semitransmissive film was made by Rutherford Backscattering Spectrometry.

The obtained half tone phase shift mask blank had 6% transmissivity to exposure light, and a phase angle of about 180°.

Next, reactive sputtering (DC sputtering) was conducted using the same DC sputtering device used in forming the light-semitransmissive film on the chromium (Cr) target under a mixed gas atmosphere of argon (Ar), carbon dioxide ($CO_2$), nitrogen ($N_2$), and helium (He); reactive sputtering (DC sputtering) was conducted on the oxidized, nitrided, carbonized chromium (CrOCN) and chromium (Cr) target under a mixed gas atmosphere of argon (Ar) and nitrogen ($N_2$); and a light shielding layer including a lamination of nitride chromium (CrN) was formed on the light-semitransmissive film. Film thickness of CrOCN layer was 30 nm, and film thickness of CrN layer was 4 nm.

Next, reactive sputtering (DC sputtering) was conducted using the same DC sputtering device used in forming the light shielding layer on the chromium (Cr) target under a mixed gas atmosphere of argon (Ar), carbon dioxide ($CO_2$), nitrogen ($N_2$), and helium (He), and a front-surface antireflection layer (film thickness: 14 nm) including oxidized, nitrided, carbonized chromium CrOCN was formed on the light shielding layer.

Thus, an ArF excimer laser exposure half tone phase shift mask blank was obtained which includes a light-semitransmissive film, a light shielding layer, and a front-surface antireflection layer laminated on a glass substrate in that order.

(Manufacture of Half Tone Phase Shift Mask (Evaluation Mask))

Next, a chemically amplified positive resist for electron beam writing (exposure) (PRL009: manufactured by FUJI-FILM Electronic Materials Co., Ltd.) was applied on the obtained half tone phase shift mask blank by spin coating with a film thickness of 150 nm. After a desired pattern was drawn on the formed resist film using electron beam drawing device, a resist pattern was formed by developing using a predetermined developing solution.

Next, dry etching was conducted on the light shielding film including a light shielding layer and a front-surface antireflection layer along the resist pattern, and a light shielding film pattern was formed. A mixture gas of $Cl_2$ and $O_2$ was used as dry etching gas in forming the light shielding film pattern.

The cross section of the obtained light shielding film pattern was observed using SEM (scanning electron microscope), showing a good result in which an angle of the cross section of the light shielding film was perpendicular to the substrate.

Next, a light-semitransmissive film was subjected to etching using the above resist pattern and the light shielding film pattern as masks to form a light-semitransmissive film pattern. A mixture gas of sulfur hexafluoride ($SF_6$) and helium (He) was used as a dry etching gas in forming the light-semitransmissive film pattern. While cross-sectional shape of the light shielding film pattern affects the etching of this light-semitransmissive film, since the light shielding film pattern has a good cross-sectional shape, the light-semitransmissive film pattern also had a good cross-sectional shape.

Thereafter, the remaining resist pattern was peeled, the resist film was applied again, pattern exposure was conducted to remove unnecessary light shielding film pattern in the transfer region, and the resist film was developed to form a resist pattern. Subsequently, wet etching was conducted, unnecessary light shielding film pattern was removed, remaining resist pattern was peeled, and a half tone phase shift mask (evaluation mask) was obtained.

The minimum line width of the evaluation mask pattern was 50 nm at the pattern size of its SRAF (sub-resolution assist feature).

Next, the evaluation mask was subjected to physical cleaning as described below.

First, the evaluation mask was introduced into a sheet-type spin cleaning machine with a megasonic nozzle (oscillating frequency: 1 MHz, maximum output: 48 W), and low power megasonic cleaning was conducted with the condition of applying oscillating frequency of 20% of maximum output to saturated hydrogen water.

On the evaluation mask after the low power megasonic cleaning, defect inspection was conducted on 132 mm×132 mm region on the light-transmissive glass substrate using a mask defect inspection device (TeraScan: manufactured by KLA-Tencor Corp.). As a result, the number of pattern loss was zero, and the number of black defects (number of unnecessary portions on light shielding film) was 143.

Thereafter, mask cleaning (high power megasonic cleaning) was conducted again for the purpose of decreasing the number of black defects. In this cleaning, high power megasonic cleaning was conducted using the same sheet-type spin cleaning machine as above under the condition of applying oscillating frequency of 60% of maximum output to saturated hydrogen water.

The same defect inspection was conducted on the evaluation mask after the high power megasonic cleaning. The number of pattern loss was zero, and the number of black defects was 45, achieving a good result.

Next, following the result of the evaluation mask mentioned above, an ArF excimer laser exposure half tone phase shift mask blank of 36 nm half pitch (hp) for DRAM application was manufactured in a similar manner as above, and using this mask blank, a phase shift mask (pattern minimum line width: 70 nm) was manufactured. The obtained phase shift mask was subjected to mask cleaning under the above-mentioned high power megasonic condition, defect inspection similar to the above was conducted, showing a good result in which the number of pattern loss was zero, and the number of black defects was satisfactory at a level with no practical problem.

Comparative Example 1

(Manufacture of Mask Blank Glass Substrate, ArF Excimer Laser Exposure Half Tone Phase Shift Mask Blank, and Half Tone Phase Shift Mask (Evaluation Mask))

A mask blank glass substrate was manufactured in a similar manner as Example 1 except for not conducting CARE step, the surface roughness of the principal surface was measured using AFM (atomic force microscope), and the result was 0.12 nm at Rms (root mean square surface roughness).

Using the obtained mask blank glass substrate, an ArF excimer laser exposure half tone phase shift mask blank was manufactured in a similar manner as Example 1.

Next, using the obtained mask blank, a half tone phase shift mask (evaluation mask) was manufactured in a similar manner as Example 1.

The same defect inspection was conducted on the evaluation mask after the low power megasonic cleaning. The number of the pattern loss was zero, and the number of black defects was 152. The number of pattern loss after the subsequent high power megasonic cleaning was 115, and the number of black defects was 34. These results were poor compared to the result of Example 1.

Further, an ArF excimer laser exposure half tone phase shift mask blank of 36 nm half pitch (hp) for DRAM application was manufactured in a similar manner as above, and using this mask blank, a phase shift mask (pattern minimum line width: 70 nm) was manufactured.

The obtained phase shift mask was subjected to the above-mentioned mask cleaning under high power megasonic condition, and the same defect inspection was conducted, in which the number of pattern loss was 38. These results were also poor compared to the result of Example 1.

Example 2

(Manufacture of ArF Excimer Laser Exposure MoSi Based Binary Mask Blank and Transfer Mask)

Using the glass substrate obtained in Example 1, an ArF excimer laser exposure binary mask blank was manufactured by the following method.

First, a light shielding layer (light shielding layer forming lower layer of light shielding film) including nitrided molybdenum silicide (MoSiN) was formed at 47 nm film thickness on the glass substrate by reactive sputtering (DC sputtering) using a DC sputtering device, using a mixture target of molybdenum (Mo) and silicon (Si) (atomic % ratio, Mo:Si=13:87) as a sputtering target under a mixed gas atmosphere of argon (Ar) and nitrogen ($N_2$). Subsequently, using the above mixture target (atomic % ratio, Mo:Si=13:87), by forming a MoSiN film (front-surface antireflection layer forming upper layer of light shielding film) with 13 nm film thickness by reactive sputtering (DC sputtering) under a mixed gas atmosphere of argon (Ar) and nitrogen ($N_2$), an ArF excimer laser (wavelength: 193 nm) light shielding film (total film thickness: 60 nm) including a lamination of a lower layer (film composition ratio (atomic % ratio), Mo:Si:N=9.9:66.1:24.0) and an upper layer (film composition ratio (atomic % ratio), Mo:Si:N=7.5:50.5:42.0) was formed. Composition analysis of each layer of the light shielding film was made by Rutherford Backscattering Spectrometry.

Next, an etching mask film was formed on the upper face of the light shielding film by the following method.

First, CrN film (film composition ratio (atomic % ratio), Cr:N=75.3:24.7) including nitrided chromium was formed at 5 nm film thickness by reactive sputtering (DC sputtering)

with a DC sputtering device using a chromium (Cr) target under a mixed gas atmosphere of argon (Ar) and nitrogen ($N_2$). A binary mask blank was obtained through the above procedure.

Next, using the binary mask blank manufactured as above, a binary transfer mask (evaluation mask) was manufactured.

First, a chemically amplified positive resist film for electron beam writing (PRL009: manufactured by FUJIFILM Electronic Materials Co., Ltd.) was formed at 150 nm film thickness on the binary mask blank.

Next, the resist film was subjected to desired pattern drawing (circuit pattern including line/space pattern of half pitch (hp) 36 nm for DRAM application) using an electron beam drawing device, followed by developing using a predetermined developing solution to form a resist pattern.

Next, using the above resist pattern as a mask, an etching mask film including CrN film was subjected to dry etching to form an etching mask film pattern. A mixture gas of chlorine ($Cl_2$) and oxygen ($O_2$) was used as dry etching gas.

Next, the remaining resist pattern was removed by ashing, etc., the light shielding film was subjected to dry etching using the etching mask film pattern as a mask, and a light shielding film pattern was formed. A mixture gas of sulfur hexafluoride ($SF_6$) and helium (He) was used as dry etching gas. Finally, the etching mask film pattern was removed using a mixture gas of chlorine ($Cl_2$) and oxygen ($O_2$), and a binary transfer mask (evaluation mask) was obtained.

Next, the evaluation mask was subjected to defect evaluation in a similar manner as Example 1.

After cleaning the evaluation mask under low power megasonic condition, the number of pattern loss was zero, and the number of black defects was 167. Thereafter, the evaluation mask was cleaned again under high power megasonic condition, showing a good result in which the number of pattern loss was zero, and the number of black defects was 50.

Further, an ArF excimer laser exposure binary mask blank of 36 nm half pitch (hp) for DRAM application was manufactured, and using this mask blank, a binary mask (pattern minimum line width: 70 nm) was manufactured.

The obtained binary mask was subjected to mask cleaning under the high power megasonic condition described above and subjected to the same defect inspection, showing a good result in which the number of pattern loss was zero, and the number of black defects was satisfactory at a level with no practical problem.

Example 3

(Manufacture of ArF Excimer Laser Exposure Ta Based Binary Mask Blank and Transfer Mask)

Using the glass substrate obtained above in Example 1, an ArF excimer laser exposure binary mask blank was manufactured with the following method.

First, a light shielding layer (film composition (atomic %), Ta:N=84:16, film thickness: 42.4 nm) including nitrided tantalum (TaN) was formed on the glass substrate by reactive sputtering (DC sputtering) using a tantalum (Ta) target as a sputtering target under a mixed gas atmosphere of argon (Ar) and nitrogen ($N_2$). Subsequently, front-surface antireflection layer (film composition (atomic %), Ta:O=42:58, film thickness: 11 nm) including oxidized tantalum (TaO) was laminated using the above tantalum (Ta) target by reactive sputtering (DC sputtering) under a mixed gas atmosphere of argon (Ar) and oxygen ($O_2$). Thus, an ArF excimer laser exposure binary mask blank having alight shielding film including a TaN light shielding layer and a TaO front-surface antireflection layer was manufactured. The composition analysis of the light shielding film was made by fluorescent Xray spectroscopy.

Next, using the binary mask blank thus manufactured, a binary transfer mask (evaluation mask) was manufactured.

First, chemically amplified positive resist film for electron beam writing (PRL009: manufactured by FUJIFILM Electronic Materials Co., Ltd.) was formed on the binary mask blank with 150 nm film thickness.

Next, the resist film was subjected to desired pattern drawing (circuit pattern including line/space pattern of half pitch (hp) 36 nm for DRAM application) using an electron beam drawing device, followed by developing using a predetermined developing solution to form a resist pattern.

Next, TaO front-surface antireflection layer was subjected to dry etching using the above resist pattern as a mask, and a front-surface antireflection layer pattern was formed. Fluorine based ($CHF_3$) gas was used as dry etching gas. Subsequently, TaN light shielding layer was subjected to dry etching using the front-surface antireflection layer pattern as a mask to form a light shielding layer pattern, and finally, the resist pattern was peeled to obtain a binary transfer mask (evaluation mask). Chlorine based ($Cl_2$) gas was used as dry etching gas of the light shielding layer pattern.

Next, the evaluation mask was subjected to defect evaluation in a similar manner as Example 1.

The number of pattern loss after cleaning the evaluation mask under low power megasonic condition was zero, and the number of black defects was 132. Thereafter, the evaluation mask was cleaned again under high power megasonic condition, showing a good result in which the number of pattern loss was zero and the number of black defects was 32.

Further, an ArF excimer laser exposure binary mask blank of 36 nm half pitch (hp) for DRAM application was manufactured, and using this mask blank, a binary mask (pattern minimum line width: 70 nm) was manufactured.

The obtained binary mask was subjected to mask cleaning under the high power megasonic condition mentioned above, and a similar defect inspection was conducted, showing a good result in which the number of pattern loss was zero, and the number of black defects was satisfactory at a level with no practical problem.

Example 4

(Manufacture of Nanoimprint Mask Blank and Nanoimprint Mold)

In Example 4, a mask blank glass substrate was manufactured in the same method as Example 1 except for using a disk shaped synthetic quartz glass substrate (outer diameter: 150 mm, thickness: 0.7 mm) instead of the mask blank substrate of Example 1, and a nanoimprint mask blank and a nanoimprint mold were manufactured by the following method.

First, a nitrided chromium (CrN) layer was formed at 2.3 nm film thickness on the glass substrate by reactive sputtering (DC sputtering) using a DC sputtering device, using a chromium (Cr) target as a sputtering target under a mixed gas atmosphere of argon (Ar) and nitrogen ($N_2$); followed by baking treatment at 200° C. in the atmosphere for 15 minutes, and front surface side of CrN layer was oxidized to form a hard mask layer. A nanoimprint mask blank was obtained through the above procedure.

Next, using the nanoimprint mask blank manufactured as above, a nanoimprint mold was manufactured.

First, a positive resist film for electron beam writing (ZEP520A: manufactured by Zeon Corp.) was formed at 45 nm film thickness on a nanoimprint mask blank.

Next, a dot pattern (hole diameter: 13.4 nm, pitch: 25 nm) was drawn on the resist film using an electron beam drawing device (applied voltage: 100 kV), and thereafter the resist layer was developed to form a resist pattern corresponding to a minute pattern.

Next, the hard mask layer was subjected to dry etching using the above resist pattern as a mask to form a hard mask pattern. A mixture gas of chlorine ($Cl_2$) and oxygen ($O_2$) was used as dry etching gas. Next, the remaining resist pattern was removed using sulfuric acid hydrogen peroxide mixture (volume ratio, concentrated sulfuric acid:hydrogen peroxide water=2:1).

The number of pattern loss after mask cleaning under the same condition as the low power megasonic condition of Example 1 was zero. Thereafter, mask cleaning was conducted again under the same condition as the high power megasonic condition of Example 1, showing a good result in which the number of pattern loss was zero.

Further, after evacuating the mixture gas used in the dry etching on the hard mask layer, the glass substrate was subjected to dry etching using fluorine based gas in the same etching device using the remaining hard mask layer as a mask. At this stage, etching was conducted with the remaining hard mask layer as a mask to form a hole corresponding to the minute pattern in the glass substrate.

Thus, after the glass substrate has been subjected to hole processing, the hard mask layer remaining on the glass substrate was subjected to wet etching using Cr etching solution containing ceric ammonium nitrate and perchloric acid, and the hard mask layer was peeled.

Through the above steps and arbitrarily cleaning and drying for cleaning off the etching liquid, etc., a nanoimprint mold was manufactured.

Example 5

(Manufacture of Mask Blank Glass Substrate, ArF Excimer Laser Exposure Half Tone Phase Shift Mask Blank, and Half Tone Phase Shift Mask)

A mask blank glass substrate was manufactured in a similar manner as Example 1, except that the slurry used in the third polishing (superprecision polishing) step in Example 1 was replaced by colloidal silica polishing solution (pH10.6) containing hydroxyethyl cellulose as an additive and ammonia as an alkaline compound. The surface roughness of the principal surface of the glass substrate obtained through CARE step achieved a good result of 0.07 nm at Rms (root mean square surface roughness).

Further, using the obtained mask blank glass substrate, an ArF excimer laser exposure half tone phase shift mask blank and a half tone phase shift mask were manufactured in a similar manner as Example 1. The obtained phase shift mask was subjected to mask cleaning in a similar manner as Example 1, and defect inspection was conducted, showing a good result in which the number of pattern loss was zero, and the number of black defects was satisfactory at a level with no practical problem.

Example 6

(Manufacture of Mask Blank Glass Substrate, ArF Excimer Laser Exposure Half Tone Phase Shift Mask Blank, and Half Tone Phase Shift Mask)

A mask blank glass substrate was manufactured in a similar manner as Example 1 except that the colloidal silica used in the third polishing (superprecision polishing) step in Example 1 was replaced by chemically modified colloidal silica. The surface roughness of the principal surface of the glass substrate obtained through CARE step showed a good result of 0.07 nm at Rms (root mean square surface roughness).

Using the obtained mask blank glass substrate, an ArF excimer laser exposure half tone phase shift mask blank and a half tone phase shift mask were manufactured in a similar manner as Example 1. The obtained phase shift mask was subjected to mask cleaning in a similar manner as Example 1, and defect inspection was conducted, showing a good result in which the number of pattern loss was zero, and the number of black defects was satisfactory at a level with no practical problem.

INDUSTRIAL APPLICABILITY

While Examples 1 to 6 given above describe examples of manufacturing a mask blank substrate, a half tone phase shift mask blank, MoSi and Ta based binary mask blanks, and a nanoimprint mask blank and a nanoimprint mold using synthetic quartz glass substrates, this invention is not limited thereto, but substrates including other materials can be used, for example, multi-component glass substrates such as $SiO_2$—$TiO_2$ based glass substrate.

REFERENCE NUMERALS

X substrate
X1 first principal surface
X2 second principal surface
Y vertical axis
1 mask blank substrate processing device
2 substrate support means
3 catalytic surface plate
3a processing reference surface
4 relative movement means
5 processing fluid supply means
6 rotating axis
7 rotating body
8 substrate support portion
8a upper face
9 substrate receiving portion
10 rotating axis
11 arm
12 pivot axis
13 supply tube
14 injection nozzle

The invention claimed is:

1. A method for manufacturing a mask blank substrate for creating a transfer pattern forming thin film on a principal surface of the mask blank substrate, the method comprising the steps of:
polishing the mask blank substrate using a polishing solution containing abrasive grains, wherein the abrasive grains are chemically modified colloidal silica, or wherein the polishing solution contains colloidal silica, an additive, and alkali compound, the additive being at least one selected from the group consisting of hydroxyethyl cellulose, hydroxypropyl cellulose, polyvinyl alcohol, polyvinylpyrrolidone, and prolan; and
conducting a Catalyst Referred Etching subsequent to the polishing, including contacting a processing fluid that under normal conditions does not show solubility to the principal surface of the substrate, and under condition of making a processing reference surface of a catalytic surface plate to be in contact with or to be in close proximity to the principal surface, causing the substrate and the processing reference surface to move relative to each other so as to subject the principal surface to Catalyst Referred Etching to remove machining-affected portions of the principal surface, wherein the processing reference surface is placed above the principal surface of the substrate so as to face the principal surface, wherein the processing reference surface is formed by creating a film of catalyst on a pad including foaming resin, and wherein the machining-affected portions are generated by the polishing.

2. The method for manufacturing a mask blank substrate according to claim 1, comprising the step of cleaning for removing foreign matters attached to the principal surface, the cleaning being conducted after removal of the polishing solution attached to the principal surface during the polishing and before the Catalyst Referred Etching.

3. The method for manufacturing a mask blank substrate according to claim 1, wherein the substrate comprises a glass material.

4. A method for manufacturing a mask blank by creating a transfer pattern forming thin film on a principal surface of a mask blank substrate polished using a polishing solution containing abrasive grains, the method comprising the steps of:

preparing a mask blank substrate polished using a polishing solution containing abrasive grains, wherein the abrasive grains are chemically modified colloidal silica, or wherein the polishing solution contains colloidal silica, an additive, and alkali compound, the additive being at least one selected from the group consisting of hydroxyethyl cellulose, hydroxypropyl cellulose, polyvinyl alcohol, polyvinylpyrrolidone, and prolan;

conducting a Catalyst Referred Etching including contacting a processing fluid that under normal conditions does not show solubility to the principal surface of the substrate, and under condition of making a processing reference surface of a catalytic surface plate to be in contact with or to be in close proximity to the principal surface, causing the substrate and the processing reference surface to move relative to each other to subject the principal surface to Catalyst Referred Etching to remove machining-affected portions of the principal surface, wherein the processing reference surface is placed above the principal surface of the substrate so as to face the principal surface, wherein the processing reference surface is formed by creating a film of catalyst on a pad including foaming resin, and wherein the machining-affected portions are generated by the polishing of the mask blank substrate; and creating a transfer pattern forming thin film wherein, after the Catalyst Referred Etching, a transfer pattern forming thin film is created on the principal surface by a sputtering method.

5. The method for manufacturing a mask blank according to claim 4, wherein the substrate comprises a glass material.

6. The method for manufacturing a mask blank according to claim 4, wherein at least the processing reference surface of the catalytic surface plate comprises at least one material selected from the group consisting of a transition metal selected from aluminum, scandium, titanium, vanadium, chromium, manganese, iron, cobalt, nickel, copper, zinc, yttrium, zirconium, niobium, molybdenum, technetium, ruthenium, rhodium, palladium, hafnium, tantalum, tungsten, rhenium, osmium, iridium, platinum, and gold, and an alloy including at least one of the transition metals.

7. The method for manufacturing a mask blank according to claim 4, wherein the processing fluid is pure water.

8. The method for manufacturing a mask blank according to claim 4, wherein the substrate comprises a glass material, the processing reference surface comprises platinum, and the processing fluid is pure water.

9. The method for manufacturing a mask blank according to claim 5, wherein the glass material is a synthetic quartz glass.

10. The method for manufacturing a mask blank according to claim 4, comprising the step of cleaning for removing foreign matters attached to the principal surface, the cleaning being conducted after removal of the polishing solution attached to the principal surface during the polishing and before the Catalyst Referred Etching.

11. The method for manufacturing a mask blank according to claim 4, wherein the transfer pattern forming thin film comprises a material comprising silicon.

12. A method for manufacturing a transfer mask, wherein the transfer pattern forming thin film of a mask blank obtained by the method for manufacturing a mask blank according to claim 4 is patterned to form a transfer pattern on the principal surface.

13. A method for manufacturing a transfer mask according to claim 12 comprising the step of physical cleaning after forming the transfer pattern.

14. A method for manufacturing a transfer mask according to claim 12, wherein the transfer mask comprises a transfer pattern with a pattern line width of 100 nm or less.

15. The method for manufacturing a mask blank substrate according to claim 1, wherein the machining-affected portions are removed by removing the principal surface up to the depth based on the polishing.

16. The method for manufacturing a mask blank substrate according to claim 1, wherein the relative movement is conducted by rotating the catalytic surface plate against the substrate.

17. The method for manufacturing a mask blank according to claim 4, wherein the machining-affected portions are removed by removing the principal surface up to the depth based on the polishing.

18. The method for manufacturing a mask blank according to claim 4, wherein the relative movement is conducted by rotating the catalytic surface plate against the substrate.

19. The method according to claim 1, wherein the abrasive grains are chemically modified colloidal silica.

20. The method according to claim 4, wherein the abrasive grains are chemically modified colloidal silica.

* * * * *